United States Patent
Jakubowicz

(10) Patent No.: US 10,418,781 B1
(45) Date of Patent: Sep. 17, 2019

(54) QUANTUM WELL PASSIVATION STRUCTURE FOR LASER FACETS

(71) Applicant: II-VI Delaware, Inc., Wilmington, DE (US)

(72) Inventor: Abram Jakubowicz, Pfaeffikon SZ (CH)

(73) Assignee: II-VI Delaware, Inc., Wilmington, DE (US)

( * ) Notice: Subject to any disclaimer, the term of this patent is extended or adjusted under 35 U.S.C. 154(b) by 0 days.

(21) Appl. No.: 16/028,573

(22) Filed: Jul. 6, 2018

(51) Int. Cl.
| | |
|---|---|
| *H01S 5/02* | (2006.01) |
| *H01S 5/068* | (2006.01) |
| *H01S 5/028* | (2006.01) |
| *H01S 5/40* | (2006.01) |
| *H01S 5/34* | (2006.01) |
| *H01S 5/22* | (2006.01) |

(52) U.S. Cl.
CPC ........ *H01S 5/06825* (2013.01); *H01S 5/0282* (2013.01); *H01S 5/2228* (2013.01); *H01S 5/3407* (2013.01); *H01S 5/4043* (2013.01)

(58) Field of Classification Search
CPC .................................................. H01S 5/0282
See application file for complete search history.

(56) References Cited

U.S. PATENT DOCUMENTS

| | | | |
|---|---|---|---|
| 5,144,634 A * | 9/1992 | Gasser .................... | H01S 5/028 372/49.01 |
| 6,289,030 B1 | 9/2001 | Charles | |
| 6,618,409 B1 * | 9/2003 | Hu .......................... | H01L 33/44 372/43.01 |
| 6,744,074 B2 | 6/2004 | Horie et al. | |
| 7,105,895 B2 | 9/2006 | Wang et al. | |
| 7,687,291 B2 | 3/2010 | Charache et al. | |
| 8,277,877 B1 | 10/2012 | Dimitrov et al. | |
| 8,908,729 B2 | 12/2014 | Harder et al. | |
| 2010/0014550 A1 * | 1/2010 | Hasegawa .............. | B82Y 20/00 372/49.01 |
| 2011/0051767 A1 | 3/2011 | Kelemen et al. | |
| 2016/0204291 A1 | 7/2016 | Kim | |

FOREIGN PATENT DOCUMENTS

EP       0 684 671 A1    11/1995

OTHER PUBLICATIONS

Kamikawa, "Highly reliable 500 mW laser diodes with epitaxially grown AlON coating for high-density optical storage," Jul. 2009, Applied Physics Letters, 95, pp. 031106-1-031106-3. (Year: 2009).*

* cited by examiner

*Primary Examiner* — Michael Carter
(74) *Attorney, Agent, or Firm* — Wendy W. Koba

(57) ABSTRACT

An edge-emitting laser diode is formed to include a quantum well passivation structure comprising alternating thin layers of a semiconductor material (e.g., silicon, germanium, or antimony) and a dielectric barrier. The semiconductor layers are sufficiently thin to form quantum wells, with the dielectric layers functioning as barriers between adjacent quantum wells. The semiconductor layer adjacent to the facet is formed of crystalline material, with the remaining quantum wells formed of amorphous material. The structure, and the method of forming the structure, results in a configuration that exhibits higher levels of COD than devices using a bulk (thick) silicon passivation layer.

21 Claims, 8 Drawing Sheets

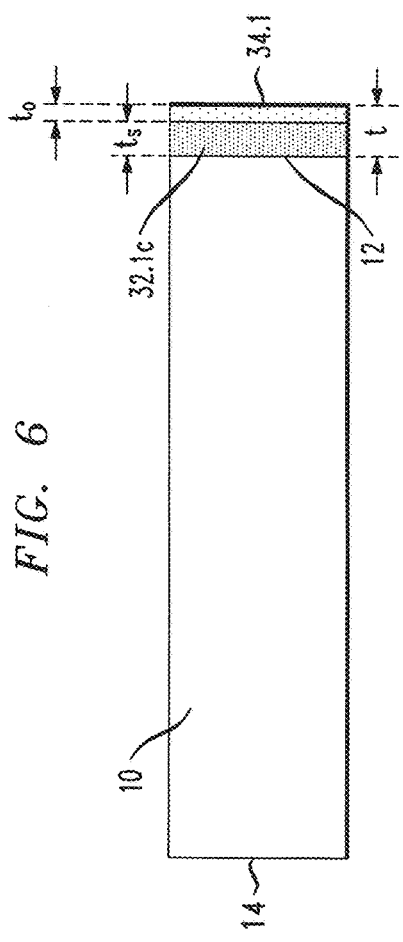
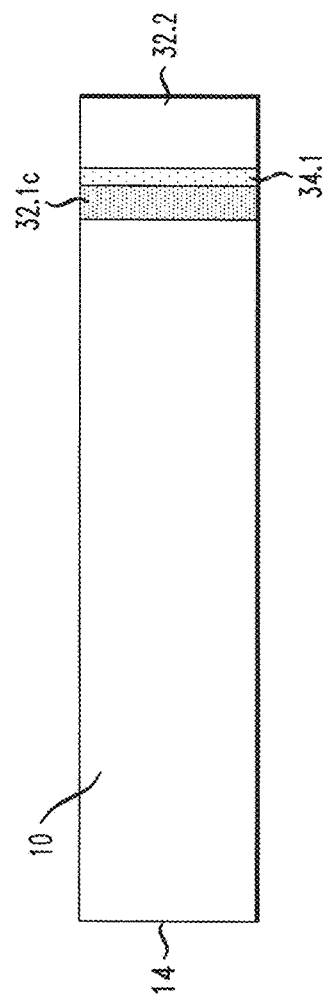

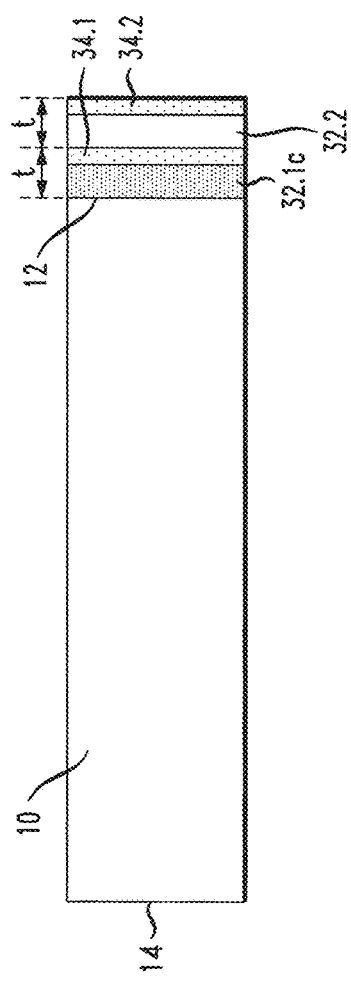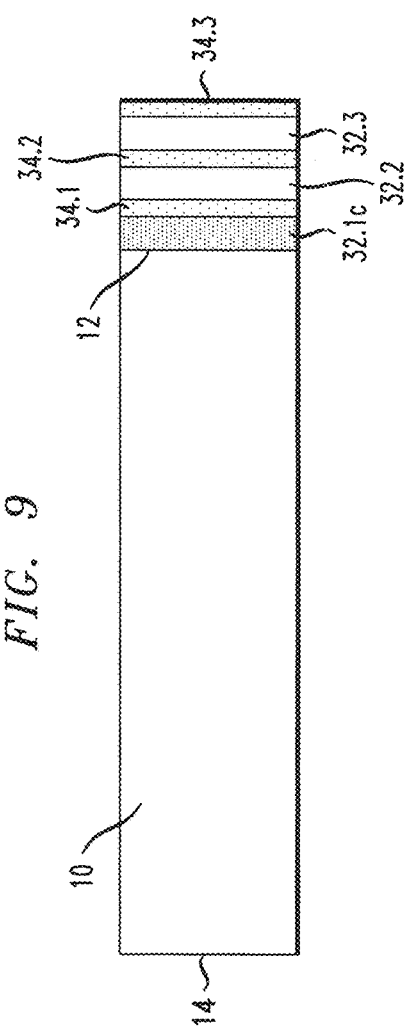

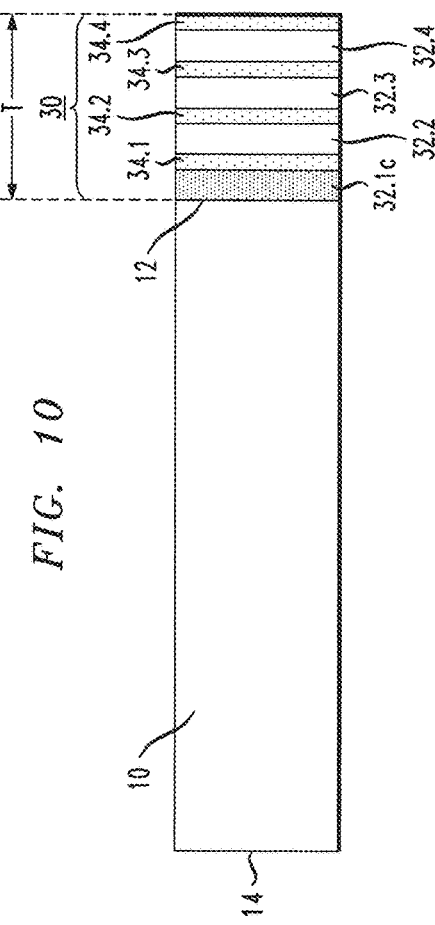
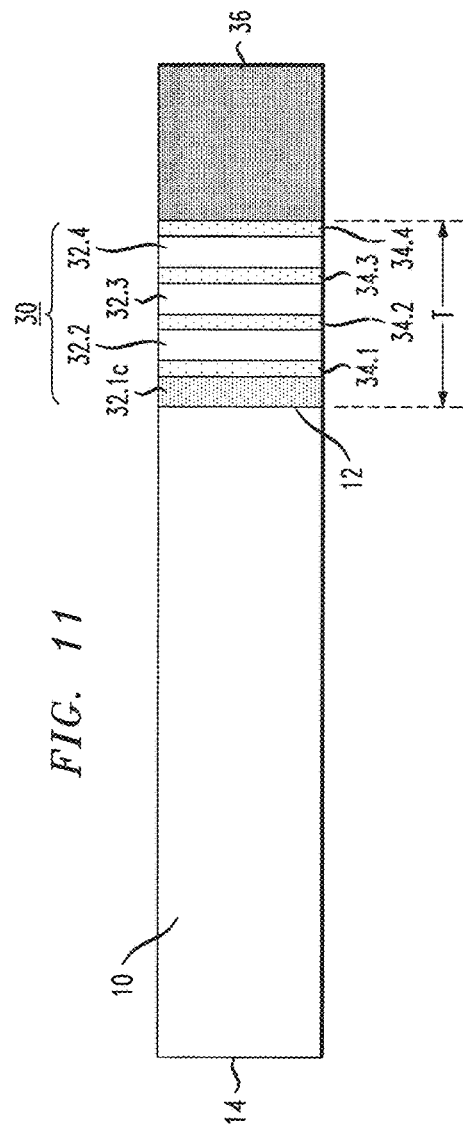

QUANTUM WELL PASSIVATION STRUCTURE FOR LASER FACETS

TECHNICAL FIELD

The present invention relates to semiconductor laser diodes and, more particularly, to a quantum well passivation arrangement for protecting the mirror facets of the laser diode.

BACKGROUND OF THE INVENTION

High power semiconductor laser diodes have become important components in the technology of optical communication, particularly because such laser diodes can be used for fiber pumping (amplification of optical signals) and other high power applications. In most cases, long lifetimes (exceeding, for example, tens of thousands of hours), reliable and stable output, high output power, high electro-optic efficiency, and high beam quality are generally desirable.

Because modern crystal growth reactors are able to produce semiconductor material of a very high quality, the long-term reliability of high-power laser diode lasers has been found to strongly depend on the stability of the laser facets cleaved to form the opposing mirrors of the laser cavity.

Laser facet degradation is a complex physical and chemical reaction process that can be driven by light, current, and heat, and can lead to short-term power degradation during burn-in, long-term power degradation during normal operation, and, in severe cases, to catastrophic optical damage (COD) to the mirror surfaces themselves, resulting in complete failure of the devices. Complex oxides and point defects can form and be trapped at the interface between the reflective coating and the semiconductor material. As current is applied to the device, charge carriers diffuse toward the facet since the surface acts as a carrier sink (due to the presence of states within the band gap created by point defects and oxidation of the surface). Light emission from the diode can photo-excite charge carriers (electrons and holes) at the facet surface, which can electro-chemically drive an oxidation reaction at the facet. Additionally, electrons and holes generated by the absorbed light can recombine in a non-radiative manner, causing excessive heat development and contributing to the formation of lattice defects (both point defects and dislocations). Heating of the semiconductor material can induce thermal oxidation at the facet, further increasing the absorbing oxide layer thickness formed at the semiconductor-oxide interface. Excessive heat in such close proximity to the facet affects the electronic structure of the materials adjacent to the facet. Heat-induced shrinkage of the optical band gap of the semiconductor crystal increases absorption of light. More absorption leads to more heating and, consequently, a thermal runaway process is initiated which results in fast degradation of the facet, as well as the material adjacent to the facet and, ultimately, to COD and failure of the facet.

For many years, a process developed by IBM and referred to as "E2 passivation" has been used to address these concerns and minimize the possibility of COD. The E2 process involves the deposition of an amorphous silicon (a-Si) layer as a passivation coating over the cleaved facets. The essence of the E2 process is to chemically stabilize the chip facets by forming the silicon directly on the bare facet surface. While silicon is clearly an excellent choice to block/eliminate facet corrosion, it has the drawback that it absorbs light emitted from/by the laser diode. The absorbed light generates charge carriers which recombine non-radiatively, producing excessive heat and contributing to defect formation. These processes accelerate degradation of the facet and can initiate a thermal runaway situation leading to COD. Thus, the passivation layer cannot be too thick, since it would then absorb too much light, create too much heat and increase the probability of COD (it is known that the COD level sharply decreases with increasing thickness of the Si passivation film). The thickness limits are dependent on the wavelength, where shorter wavelengths are absorbed more strongly and the device performance situation becomes more critical for short wavelength laser diodes. However, while the passivation film should be as thin as possible in terms of light absorption, long-term life tests have shown that a film that is too thin does not sufficiently protect the surface of the facet. The thickness of the Si film is also a critical parameter for facets exposed to ions/atoms having higher energy, e.g., during the deposition of standard mirror coatings by ion beam sputtering, used to obtain the required mirror reflectivity.

From the above discussion, it is clear that one challenge to overcome is to reduce the absorption of light in the passivation film while at the same time keeping the passivation film sufficiently thick to protect the facet—which are obviously contradictory requirements in terms of the preferred thickness of the silicon passivation film. Additionally, the passivation structure needs to be formed in a manner that minimizes the number of charge carriers (produced by absorbed light) that are capable of reaching the chip cleaved facet by diffusion. Further, the passivation structure must not react with the facet, instead stabilizing the facet surface and preventing diffusion/migration of mobile atomic species/impurities to the facet. Moreover, the passivation structure itself should not be a source of facet contamination.

SUMMARY OF THE INVENTION

The need remaining in the prior art is addressed by the present invention, which relates to semiconductor laser diodes and, more particularly, to a quantum well passivation arrangement for protecting the mirror facets of the laser diode.

In accordance with one or more embodiments of the present invention, the prior art thick-film amorphous silicon passivation structure is replaced by a quantum well structure comprising alternating, thin layers of silicon and silicon oxide or nitride (or another suitable semiconductor material, such as germanium or antimony, and their oxides or nitrides (or other suitable barrier materials)). The semiconductor materials can be in either their pure form, or a hydrogenated form that is known to lower the defect density. An initial semiconductor layer is deposited over the bare facet surface, with the reaction process controlled to create a thin (e.g., about 3 nm) layer associated with exhibiting quantum properties (as opposed to thicker layers which exhibit the conventional properties of bulk material). The device is then processed to create a thin barrier layer. In one exemplary embodiment, the device is exposed to oxygen to convert a surface portion of the semiconductor layer to its oxide. A second (thin) layer of the semiconductor is then deposited over the oxide and then oxidized to convert a portion of this second layer to its oxide constituent, thus forming the quantum well structure. If it is intended to form a multiple quantum well (MQW) structure, which may be preferred for many applications, the steps of semiconductor deposition and oxidation are repeated.

An advantage of the quantum well passivation structure of the present invention is that these quantum wells will have a larger optical band gap compared to a thick silicon layer and will thus absorb less light emitted from the laser diode.

An exemplary embodiment of the present invention relates to a method of forming a passivation structure over a facet of an edge-emitting laser diode, and includes at least the following steps: a) depositing, in a reaction chamber, a thin layer of a semiconductor to cover an exposed laser facet surface, the thickness of the deposited layer controlled to create a quantum well structure; b) oxidizing a surface portion of the semiconductor layer to create a thin layer of oxide; and c) repeating steps a) and b) to form a quantum well passivation structure of alternating semiconductor quantum wells and oxide barriers.

Another exemplary embodiment of the present invention takes the form of an edge-emitting laser diode comprising a semiconductor substrate having a waveguide structure formed thereon for generating light at an operating wavelength, a pair of cleaved facets formed on opposing faces of the waveguide structure, a passivation structure comprising a configuration of a plurality of semiconductor quantum wells alternating in position with a plurality of layers of oxide material, and a reflective coating formed directly over the passivation structure.

Other and further embodiments and aspects of the present invention will become apparent during the course of the following discussion and by reference to the accompanying drawings.

BRIEF DESCRIPTION OF THE DRAWINGS

Referring now to the drawings,

FIGS. 4-10 illustrate an exemplary series of processing steps that may be used to fabricate an MQW passivation structure in accordance with the principles of the present invention;

FIG. 11 schematically illustrates an exemplary completed laser diode formed to include the MQW passivation structure of the present invention, including a standard reflective coating deposited on top of the passivation structure;

DETAILED DESCRIPTION

Figure 1:
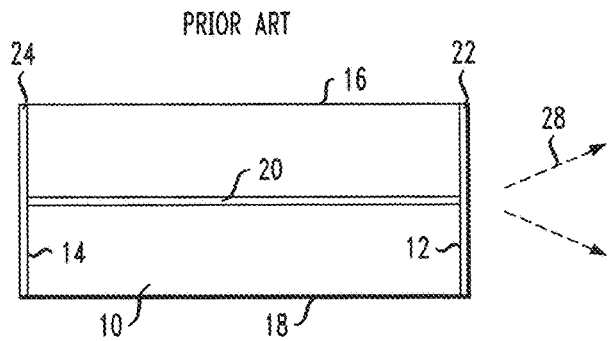
FIG. 1 illustrates a conventional edge-emitting laser diode.

FIG. 1 illustrates a typical edge-emitting laser diode formed in a semiconductor opto-electronic chip (or "bar") 10 having a front facet 12 and an opposing rear facet 14. Bar 10 includes a vertical structure that is typically composed of layers of AlGaAs, GaAs, InGaAs and related III-V semiconductor materials epitaxially deposited on a GaAs substrate. However, it is to be understood that other material combinations are possible for use in creating an optical emitting device.

In the commercial production of these laser diodes, a large number of such bars are simultaneously formed on a single GaAs wafer, with the wafer then cleaved along natural cleavage planes to form a large number of separate bars 10 having the front and back facets 12, 14, as well as the perpendicularly-arranged sides 16, 18.

The semiconductor processing performed on the wafer also forms in each of the bars a waveguide structure 20 extending between facets 12, 14. While in most cases waveguide structure 20 is a ridge waveguide, other configurations are possible (e.g., a buried heterostructure waveguide). For many high power applications, waveguide structure 20 may have a width substantially larger than the lasing wavelength so as to form a broad-area laser.

As part of the usual fabrication procedure, cleaved facets 12, 14 are subjected to the standard E2 passivation process. That is, facets 12, 14 are coated with passivation layers 22, 24 which preferably comprise amorphous silicon (a-Si). The essence of the E2 process is to chemically stabilize chip facets 12, 14 by forming the silicon directly on the bare facet surface. While silicon is clearly an excellent choice to block/eliminate facet corrosion, it has the drawback that silicon naturally absorbs light emitted by the laser diode. That is, the absorbed light generates charge carriers that recombine non-radiatively and produce excessive heat. These processes accelerate the degradation of the facet and may initiate a thermal runaway situation leading to COD. As a result, the overall thickness of the passivation layers needs to be controlled to minimize this possibility.

Indeed, in principle, it would seem that a thin silicon film would be sufficient to chemically stabilize the facet. However, long-term life tests have shown that a thin film provides insufficient protection for long duration operation. Even in the case of a thin film which covers the surface roughness/cleavage-related steps completely, the film thickness has not been found to be sufficient to function as an effective barrier that prevents in-diffusion of foreign atoms/ impurities.

The present invention addresses these concerns by replacing the thick silicon film (which exhibit the properties of a bulk material) by a quantum well structure comprising semiconductor quantum wells (QW) interleaved with barrier layers (e.g., oxides, nitrides, and the like). Preferred semiconductor materials suitable for use as a quantum well passivation structure include silicon, germanium, and antimony, in either their pure form or their hydrogenated form. The hydrogenated form containing a sufficient amount of hydrogen to lower the density of defects within the semiconductor material via saturation of dangling bonds. For the sake of convenience, the following discussion will focus on the use of silicon/silicon oxide for such a quantum well/ barrier passivation structure with the understanding that other suitable materials may be used. It is also to be understood that besides oxides and nitrides of Si, Ge, and Sb, oxides and nitrides of other materials (such as, but not limited to, aluminum, titanium, and tantalum) may be used to form the barriers of the QW passivation structure.

Figure 2:
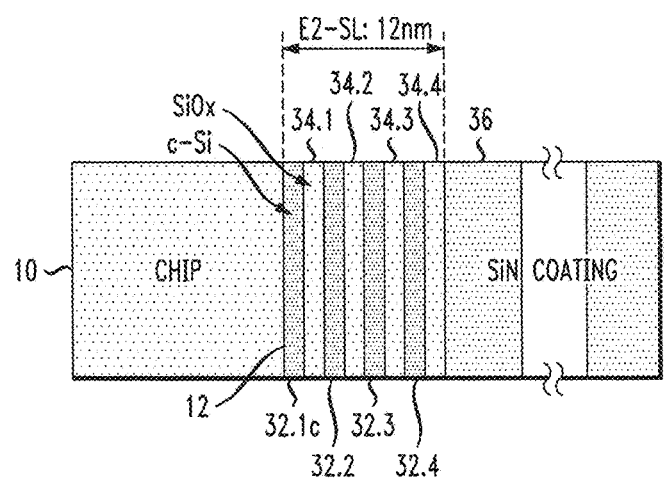
FIG. 2 is a plan view of an exemplary edge-emitting laser diode formed in accordance with the present invention to include an MQW passivation structure formed over a laser facet.

FIG. 2 illustrates an exemplary edge-emitting laser diode including a quantum well passivation structure 30 formed in accordance with the principles of the present invention. As with the conventional laser diode discussed above, the inventive laser diode comprises a semiconductor chip 10 formed to include facets 12 and 14. The laser diode of the present invention as shown in FIG. 2 is formed to include quantum well passivation structure 30, which is disposed as shown to cover facet 12 (it is to be understood that the same process may be used to form a quantum well passivation structure on opposing facet 14).

As will be described in detail below, quantum well structure 30 comprises alternating layers of a semiconductor material and a dielectric barrier, disposed over an exposed surface of facet 12. In accordance with the principles of the present invention, each individual layer is relatively thin (on the order of a few nm) to create the desired quantum well/barrier structure. The process of forming the multilayer QW/barrier stack is carried out until a final stack having a thickness essentially on the order of the prior art a-Si passivation film is formed. In some embodiments, a single well structure may be sufficient.

Referring to the particular embodiment as shown in FIG. 2, an initial silicon layer 32.1 of quantum well structure 30 is shown as deposited on an exposed top major surface 12S of facet 12. Silicon layer 32.1 is deposited using well-known techniques (such as those used for the E2 process). In accordance with the present invention, silicon layer 32.1 is formed to a thickness of only a few nm (say, 3 nm) in order to provide the desired quantum well configuration. Once the initial silicon layer 32.1 has been formed, the device is then exposed to oxygen to oxidize a surface portion of silicon layer 32.1 and thus form a first silicon oxide layer 34.1. The oxidation process is monitored in accordance with the present invention to control the thickness of created oxide layer 34.1. For example, it may be desired to create a thickness in the range of about 1.0-2 nm for first oxide layer 34.1. With this thickness, remaining silicon layer 32.1 will have a final thickness of about 1-2 nm, or slightly less. The combination of remaining silicon layer 32.1 and oxide layer 34.1 forms a quantum well passivation structure. If it is preferred to form a "multiple" quantum well structure (which is typically the case), an additional thin (~3 nm) silicon layer 32.2 is deposited over oxide layer 34.1 and the device is again exposed to oxygen, transforming a top portion of silicon layer 32.2 into a second silicon oxide layer 34.2. The steps of deposition and oxidation may then continue, building a stack of layers as shown in FIG. 2 to form quantum well structure 30. It is to be understood that these material selections are exemplary only, and other materials may be used to form both the quantum well and the barrier layers. Indeed, the barrier may comprise oxides or nitrides of silicon, germanium and antimony, as well as specific materials such as aluminum oxide, titanium oxide, aluminum nitride, and tantalum oxide.

Once the desired number of quantum wells have been formed, a standard coating layer 36 (such as $Si_xN_y$) is formed over the top surface of the outermost barrier layer (here, shown as silicon oxide layer 34.4). It is to be understood that the number of individual layers, as well as their thicknesses, are design considerations and may be adjusted or varied, as the case may be, for different situations, as long as the layers remain thin enough to exhibit their quantum properties and not conventional bulk material properties. These different situations may include, for example, creating laser diodes for operation at extremely high power levels, lasers operating at different wavelengths, or situations when the facet is exposed to high energy ions during processing (e.g., during deposition of a standard mirror coating by ion beam sputtering).

Figure 3:
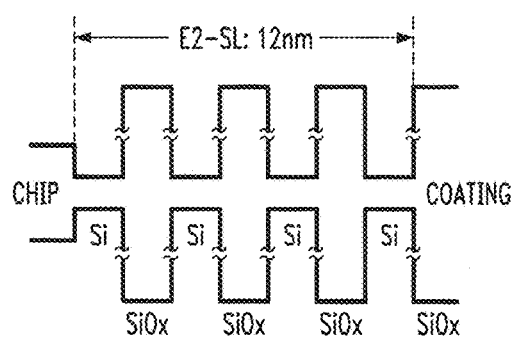
FIG. 3 is a quantum well diagram associated with the inventive MQW passivation structure as shown in FIG. 2.

FIG. 3 is a diagram depicting an exemplary QW/barrier structure formed by the alternating layers of silicon and silicon oxide. As mentioned above, one problem with using the prior art thick silicon layer as a facet coating is that it absorbs a portion of the light being emitted by the laser chip. The absorbed light generates a sufficient amount of charge carriers to recombine non-radiatively, contributing to excessive heat and facet degradation. This facet degradation occurs in particular via recombination-enhanced formation, reactions and propagation of defects, assisted by the generation of excessive heat. The higher the number of non-radiatively recombining carriers at a particular site/location, the faster the degradation of the material at this site. From this, it can be shown that slowing down the process of degradation may be possible by the appropriate spatial redistribution of carriers generated by light absorption in the passivation structure. In accordance with the principles of the present invention, this result is achieved by employing the quantum well structure with the higher band-gap barrier material confining any recombination to the local quantum wells. The use of such a quantum well structure has therefore been found not only to reduce absorption of the laser emission, but also minimize the number of charge carriers reaching the chip facet and by these means significantly slow down the facet degradation process.

FIGS. 4-11, as now described in detail below, illustrate an exemplary set of processing steps that may be used to form a quantum well passivation structure for edge-emitting laser diodes in accordance with the present invention. It is to be understood that the inventive passivation process may be applied to the facets while the lasers remain in bar form. Indeed, it is possible to process multiple laser bars at the same time, thus significantly reducing fabrication time and improving the efficiency of the overall process.

Figure 4:
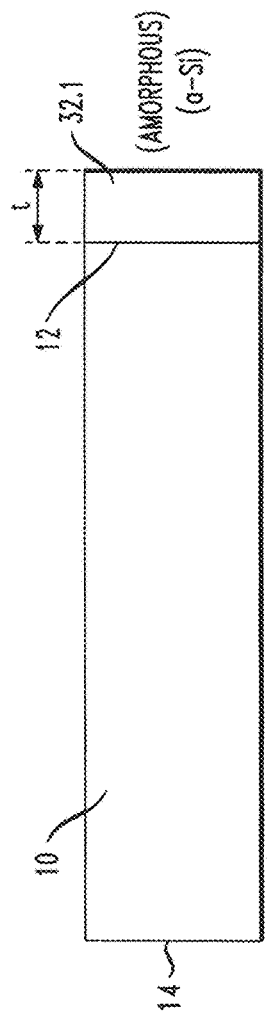

FIG. 4 illustrates a laser diode structure at the beginning of the passivation process. It is to be understood that laser chip 10 as shown in FIG. 4 has been fully processed to include the various III-V material layers required to form a laser device, and has reached the point in the fabrication process where end facets 12 and 14 have been formed by a cleaving operation, creating several "bars" of laser diodes from a processed GaAs wafer. Indeed, while not explicitly illustrating an entire laser diode bar, it is to be understood that the method of providing quantum well passivation in accordance with the present invention may be performed on a bar structure of a plurality of laser diodes, as well as on individual laser diodes themselves. It is contemplated that in most cases it is preferred to perform the passivation simultaneously on a set of laser diode bars, providing an efficient mass production technique.

Figure 5:
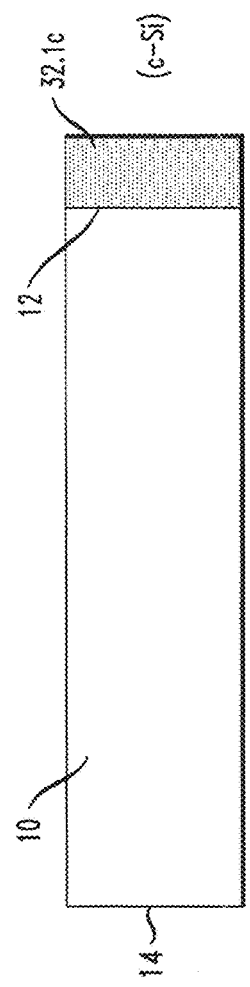

FIG. 4 illustrates laser chip 10 immediately after being cleaved to expose end facets 12 and 14. As shown, the initial step in the facet passivation process is the deposition of initial silicon layer 32.1 over exposed end surface 12S of end facet 12. The deposition may be performed within the same equipment used for the prior cleaving operation. Subsequent to the creation of initial silicon layer 32.1, the device is exposed to oxygen, which serves to oxidize the outermost surface of silicon layer 32.1, converting it to silicon oxide. FIG. 5 emphasizes that the amorphous silicon layer is treated to become crystalline and thus form a crystalline interface with the chip. It is to be understood that the crystallization can be performed at different stages of the process, as discussed below in association with the discussion of FIG. 11.

FIG. 6 shows a first oxide layer 34.1 as created from a top portion of silicon layer 32.1. The length of exposure to oxygen determines the thickness of created silicon oxide layer 34.1 (and similarly, the thickness of remaining silicon layer 32.1). As shown in FIG. 6, the remaining silicon layer 32.1 has a final thickness of $t_s$ and oxide layer 34.1 has a thickness of $t_o$, where $t_s+t_o$ is approximately the same as the initially-deposited silicon layer. A slightly varied thickness is expected due to the oxidation adding oxygen atoms to the passivation structure. Thus, when creating an oxide layer to a thickness of 1 nm from an initial silicon layer having a thickness of 3 nm, the final thickness $t_s$ of layer 32.1 will be on the order of 2 nm. For the purposes of creating a silicon quantum well structure in accordance with the present invention, initial silicon layer 32.1 (as well as all subsequently deposited silicon layers) needs to be relatively thin, about 3 nm or less (depending on the wavelength of light emitted by the laser diode). The process then continues, as shown in FIG. 7, by depositing a second layer of silicon (denoted as silicon layer 32.2) over first silicon oxide layer 34.1. Second layer 32.1 is deposited to a thickness which allows for the formation of a quantum well.

For embodiments where it is desired to form a multiple number of quantum wells, the process continues by again exposing device 10 to oxygen, followed by another deposition of a thin silicon layer and so on. In each process cycle, the exposure to oxygen results in the oxidation of the outermost surface of the newly-deposited silicon layer 32. FIG. 8 illustrates the structure in progress, showing a second oxide layer 34.2. The remaining thickness of the immediately underlying silicon layer is shown as silicon layer 32.2 in FIG. 8. The steps of depositing silicon and forming a silicon oxide may be performed numerous times, forming a silicon multiple quantum well form. A significant advantage of the process of the present invention is that each consecutive silicon layer is deposited in a contamination-free chamber, which, each time, maintains a pristine surface for subsequent processing. Said another way, on an atomic scale, the inventive process is "cleaner" than prior art facet passivation techniques.

It is to be noted that in the standard E2 process, after the deposition of the single silicon passivation layer, the device is removed from the contamination-free reaction chamber and the rest of mirror processing is performed outside of this chamber. Therefore, when the single silicon layer is kept very thin (as proposed in the prior art for minimizing thermal runaway associated with absorption of light), a situation emerges in which the exposed surface of the passivation layer is extremely close to the chip facet and increases the risk of facet contamination from diffused/migrated mobile atomic species/impurities. In contrast to this situation, the inventive structure maintains the final, exposed silicon layer (here, layer 32.4) as far away from the facet as necessary to prevent contamination by mobile atomic species.

FIG. 8 illustrates laser chip 10 after an additional step of silicon deposition and silicon oxide formation, showing additional silicon layer 32.3 and oxide layer 34.3. A final form of structure 30 is shown in FIG. 9, where an additional set of silicon deposition and oxide formation steps have been performed on the structure as shown in FIG. 8. Referring back to FIG. 2, the final structure of quantum well passivation structure 30 is formed to exhibit a desired thickness T which may be similar to the thickness of a standard silicon passivation film formed with the E2 process. FIG. 10 illustrates a final step in the process, where a protective layer 36 (such as, for example, silicon nitride) is formed over outer oxide layer 34.4.

As formed, initial silicon layer 21.1 is an amorphous silicon layer, which if left in this state would interact with facet 12 in a manner that would lead to COD at relatively low current/power levels. Thus, it is desirable to condition layer 32.1 to form a crystallized silicon layer 32.1c. Various techniques well-known in the art may be used to provide this conditioning including, but not limited to, operation at a reduced current for a limited period of time (sometimes referred to as "training"). Alternatively, an ex-situ process may be used, such as described in our co-pending U.S. application Ser. No. 15/996,614, filed Jun. 4, 2018 and herein incorporated by reference, which describes the use of an external energy source to irradiate the passivation material and convert it into crystalline form. It is to be understood that the conditioning step can be performing at different stages of mirror processing (e.g., directly after the deposition of the first silicon layer, at the completion of the quantum well fabrication process, when the mirror is complete (including the deposition of a reflective outer coating), or at any point in between. FIG. 11 illustrates the passivation structure with the crystallized form of this first silicon layer, illustrated here as silicon layer 32.1c.

Figure 12:
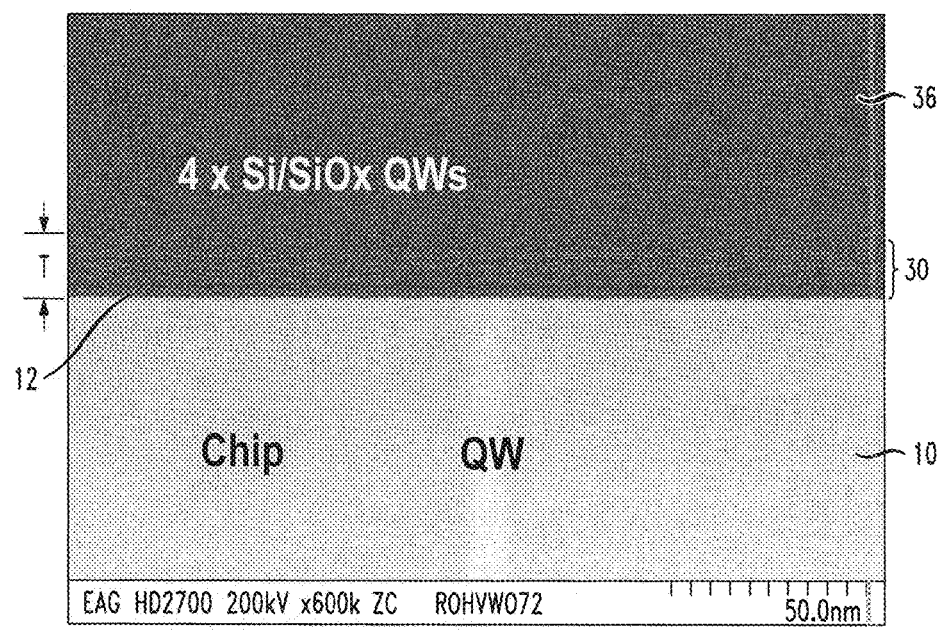
FIG. 12 is a high resolution STEM of an exemplary laser diode formed to include the MQW passivation structure of the present invention.

FIG. 12 is a high resolution STEM of an exemplary laser diode formed to include the quantum well passivation structure of the present invention. The quantum well form of structure 30 is clearly visible, formed as a passivation interface between facet 12 and outer protective layer 36 of laser chip 10.

Figure 13:
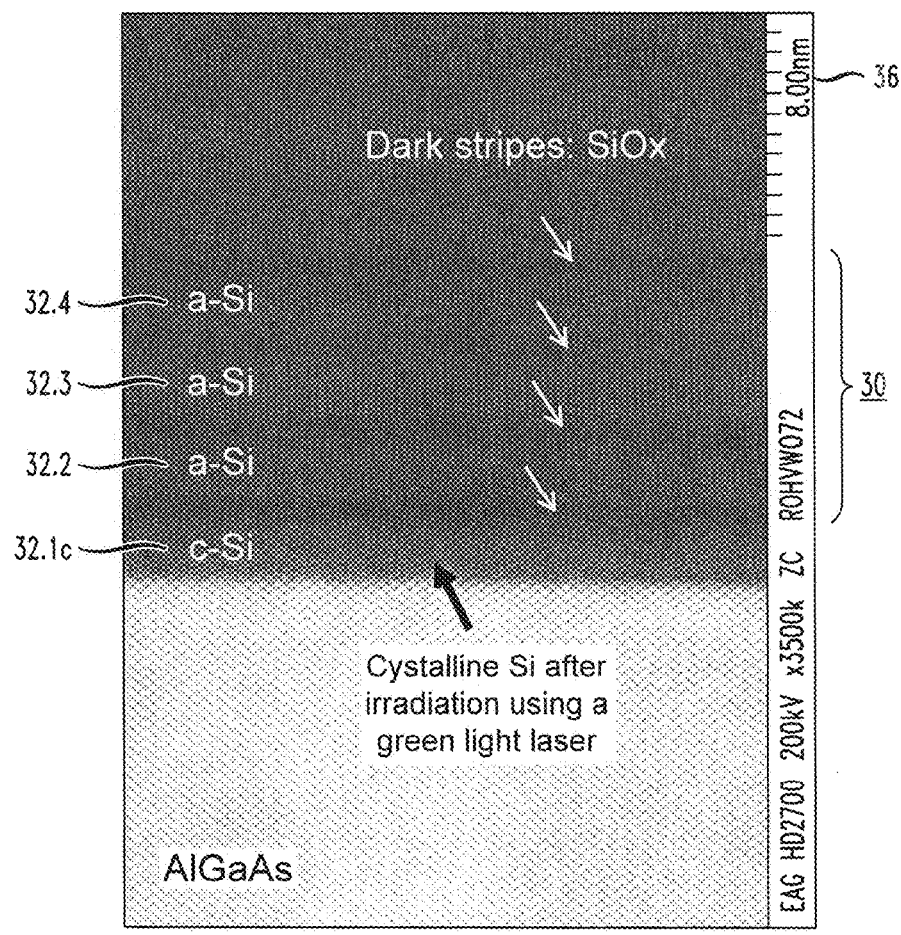
FIG. 13 is another high resolution STEM of an exemplary laser diode formed in accordance with the present invention, in this case where an ex-situ conditioning process has been used to crystallize an initial amorphous silicon layer.
Figure 14:
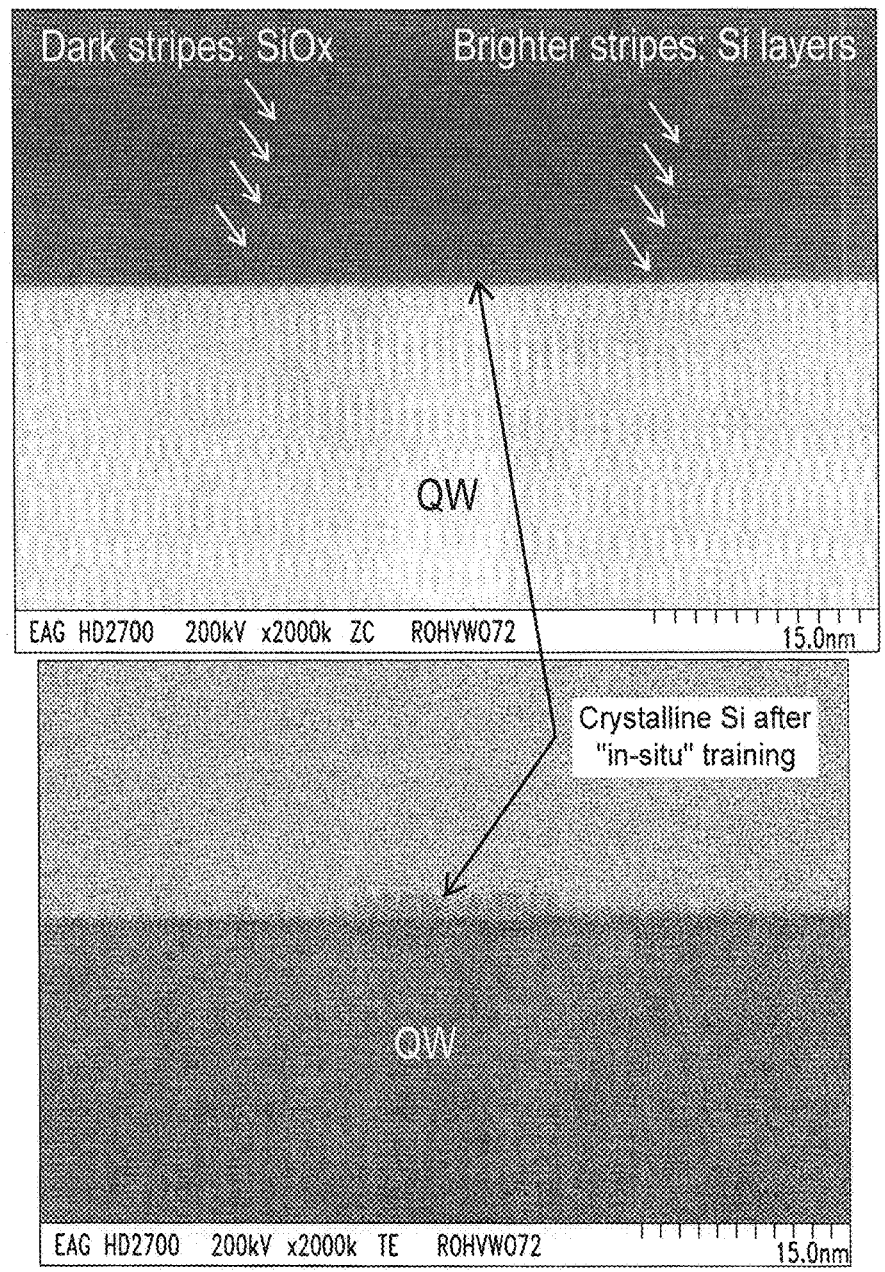
FIG. 14 is a high resolution STEM of yet another embodiment of the present invention, in this case where an in-situ process was used to crystallize the initial silicon layer prior to forming the remainder of the MQW passivation structure.

FIG. 13 is another high resolution STEM of an exemplary laser diode formed to include the quantum well passivation structure of the present invention, in this case where an ex-situ conditioning process (as fully described in our above-cited co-pending application) has been used to crystallize the initial amorphous silicon layer 32.1 to form crystalline silicon layer 32.1c. FIG. 14 is a high resolution STEM of yet another embodiment of the present invention, in this case where an in-situ process was used to condition initial silicon layer 32.1c.

As noted above, less absorption of the laser's output emission by the inventive passivation structure is expected, due to the larger effective bandgap in quantum wells, as compared to the prior art use of bulk silicon material. An advantageous feature of the laser diode structure of the present invention is that any charge carriers produced within the individual quantum wells will recombine "locally"; that is, within that specific layer itself.

If any undesired species (atoms or molecules) are present in either the coating material or at the passivation structure/coating interface, their diffusion through the passivation structure to the facet (or chemical reaction with the facet) cannot be initiated without the application of an external driving force. The absorption of light energy is one such force, but the quantum well configuration of the passivation structure is considered to thwart this capability, minimizing the amount of charge carriers generated at the facet and in the passivation layers and thus the resultant excessive heat and the defect formation process.

The present invention may be embodied in other specific forms without departing from its spirit or essential characteristics. The described embodiments are to be considered in all respects only as illustrative, and not restrictive. The scope of the invention is, therefore, indicated by the appended claims rather than by the foregoing description. All changes that come within the meaning and range of equivalency of the claims are to be embraced within their scope.

What is claimed is:

1. A method of forming a passivation structure over a facet of an edge-emitting laser diode, comprising:
   a) depositing, in a reaction chamber, a thin layer of amorphous semiconductor material to cover an exposed laser facet surface, the exposed laser facet surface being as-cleaved or post-cleaved conditioned, with the thickness of the deposited amorphous semiconductor material controlled to create a quantum well structure; and b) forming a thin layer of dielectric material over the quantum well structure, the thickness of the formed dielectric material controlled to create a quantum barrier for the quantum well structure.

2. The method as defined in claim 1, wherein the method further comprises the step of c) repeating steps a) and b) to form a multiple quantum well passivation structure of alternating semiconductor quantum wells and quantum barriers.

3. The method as defined in claim 2 wherein each deposited semiconductor layer exhibits a thickness of about 3 nm or less.

4. The method as defined in claim 1 wherein the method further comprises the step of performing a conditioning of the thin layer of amorphous semiconductor material deposited in step a).

5. The method as defined in claim 1 wherein in performing step a) a semiconductor material selected from the group of silicon, germanium, and antimony is deposited.

6. The method as defined in claim 5 wherein the selected semiconductor material is in a pure form.

7. The method as defined in claim 5 wherein the selected semiconductor material is in a hydrogenated form.

8. The method as defined in claim 1 wherein the semiconductor layer deposited in step a) exhibits a thickness of about 3 nm or less.

9. The method as defined in claim 1 wherein step b) comprises the step of oxidizing a surface portion of the semiconductor material deposited in step a).

10. The method as defined in claim 1 wherein in performing step b), the dielectric material is selected from the group consisting of: oxides of silicon, germanium, antimony; nitrides of silicon, germanium antimony; aluminum oxide; titanium oxide; aluminum nitride; and tantalum oxide.

11. The method as defined in claim 1 wherein the method is performed on a laser bar comprising a plurality of separate laser diodes.

12. An edge-emitting laser diode comprising a semiconductor substrate having a waveguide structure formed thereon for generating light at an operating wavelength;

a pair of cleaved facets formed on opposing faces of the waveguide structure;

a passivation structure comprising a quantum well configuration of at least one semiconductor quantum well and a dielectric quantum barrier formed on the semiconductor quantum well; and a reflective coating formed directly over the passivation structure.

13. The edge-emitting laser diode as defined in claim 12 wherein the at least one semiconductor quantum well comprises a single semiconductor quantum well.

14. The edge-emitting laser diode as defined in claim 13 wherein the single semiconductor quantum well comprises a layer of crystalline material.

15. The edge-emitting laser diode as defined in claim 12 wherein the at least one semiconductor quantum well comprises a plurality of semiconductor quantum wells, separated by quantum barrier layers to create a multiple quantum well structure.

16. The edge-emitting laser diode as defined in claim 15 wherein a first semiconductor quantum well, disposed adjacent to the facet, comprises crystalline material, with the remaining quantum wells comprising amorphous material.

17. The edge-emitting laser diode as defined in claim 12 wherein each semiconductor quantum well comprises a layer of material having a thickness no greater than about 3 nm.

18. The edge-emitting laser diode as defined in claim 12 wherein the semiconductor material is selected from the group consisting of: silicon, germanium, and antimony.

19. The edge-emitting laser diode as defined in claim 18 wherein the selected semiconductor material is in a pure form.

20. The edge-emitting laser diode as defined in claim 18 wherein the selected semiconductor material is in a hydrogenated form.

21. The edge-emitting laser diode as defined in claim 12 wherein the dielectric quantum barrier comprises a material is selected from the group consisting of: oxides of silicon, germanium, antimony; nitrides of silicon, germanium antimony; aluminum oxide; titanium oxide; aluminum nitride; and tantalum oxide.

* * * * *